United States Patent [19]

Kenny

[11] Patent Number: 5,010,507
[45] Date of Patent: Apr. 23, 1991

[54] SAMPLED DIGITAL FILTER SYSTEM

[75] Inventor: Thomas J. Kenny, Plum Borough, Pa.

[73] Assignee: Westinghouse Electrical Corp., Pittsburgh, Pa.

[21] Appl. No.: 301,406

[22] Filed: Jan. 25, 1989

[51] Int. Cl.$^5$ .............................................. G06F 15/31
[52] U.S. Cl. .............................. 364/724.01; 341/122; 341/61
[58] Field of Search ................ 364/724.01, 724.07, 364/724.1; 341/61, 122, 123

[56] References Cited

U.S. PATENT DOCUMENTS

| 4,021,616 | 5/1977 | Betts | 364/724.01 |
|---|---|---|---|
| 4,244,004 | 1/1981 | Yamada | 341/122 |
| 4,281,318 | 7/1981 | Candy et al. | 364/724.01 |
| 4,541,009 | 9/1985 | Rougeolle et al. | 341/122 |
| 4,621,254 | 11/1986 | Belcher | 341/122 |
| 4,656,598 | 4/1987 | Wilson | 364/724.01 |
| 4,789,995 | 12/1988 | Hurst et al. | 364/724.01 |
| 4,797,845 | 1/1989 | Stikvoort | 364/724.01 |
| 4,833,474 | 5/1989 | Nagai et al. | 364/724.01 |

OTHER PUBLICATIONS

Kloker, Kevin L., "The Motorola DSP5600 Digital Signal Processor", *IEEE Micro*, pp. 29–48, Dec. 1986.

*Primary Examiner*—Dale M. Shaw

[57] ABSTRACT

A sampled digital filter system for filtering a signal that has a frequency lower than an unwanted signal component in the input signal. The digital filter system samples the input signal in bursts at a rate satisfying the Nyquist criterion for the unwanted signal component.

6 Claims, 2 Drawing Sheets

SAMPLED DIGITAL FILTER SYSTEM

BACKGROUND OF THE INVENTION

Generally, digital control systems have a variety of inputs to a system processor with differing frequencies. These inputs may be affected by system noise such as line frequency noise, switching noise or crosstalk between various input signal lines in the system. If the input signals have a low frequency relative to the system noise, the noise can be filtered by sampling the input so as to satisfy the Nyquist criterion of the system noise, and applying these samples to a digital filter.

However, in some systems, the extra processing required due to sampling at the higher rate cannot be accommodated by the system processor. For example, in a time multiplexed system, a processor sequentially processes channel input samples from a number of channels. The maximum processing time allotted to a given channel depends upon the sampling rate at which each channel is sampled. Thus, sampling at a rate to satisfy the Nyquist criterion of the system noise restricts the amount of time available to process a channel input sample. The processor must execute the digital filter algorithm and the necessary system signal processing within the time allotted for the channel. The system signal processing can include, for example, limited checking and linearizing the sample channel inputs.

SUMMARY OF THE INVENTION

It is an object of the present invention to provide a digital filter system wherein unwanted signal components are efficiently digital filtered from an input signal.

It is another object of the present invention to provide a digital filter system wherein the processing time needed to filter an unwanted signal component is minimized.

It is a further object of the present invention to provide a digital filter system capable of digital filtering unwanted signal components on a time multiplexed basis.

It is still another object of the present invention to provide a digital filter system wherein unwanted signal components are digital filtered on a non-continuous basis.

To achieve the above and other objects, the present invention provides a system for processing an input signal including an unwanted signal component, the system comprises a sampling means for receiving the input signal, and for sampling the input signal with first and second sampling intervals and providing samples of the input signal as input samples; and digital filter means for digital filtering the input samples so as to provide a filtered output corresponding to the input signal with the unwanted signal component substantially filtered.

In a preferred embodiment of the present invention, the sampling means can comprise, for example, an analog-to-digital (A/D) converter which samples the input signal in each of the first sampling intervals. The sampling within each of the first sampling intervals is at a second sampling interval which is much shorter than the first sampling interval. The digital filter means of the present invention can comprise a processor or hard wired circuit that performs any known digital filter algorithm.

DESCRIPTION OF THE PREFERRED EMBODIMENT

Figure 1:
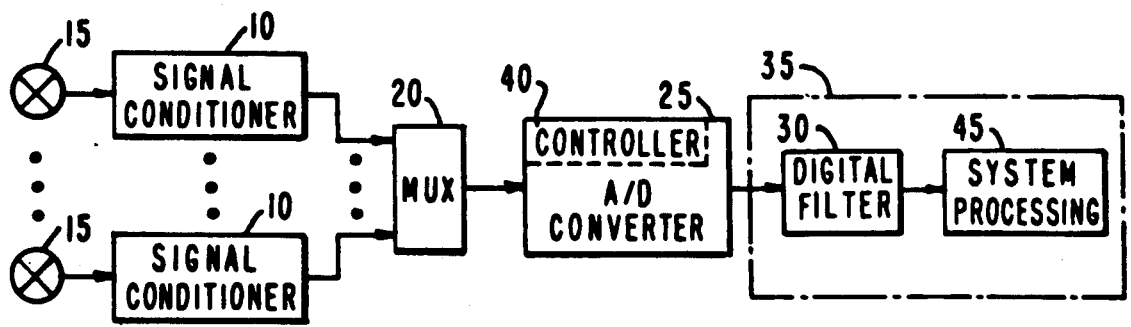
FIG. 1 is a block diagram of a system embodying the present invention.

Referring to FIG. 1, a signal conditioner 10 receives a signal from a sensor 15. There can be a number of sensors 15 and signal conditioners 10, each comprising a channel. If there are a number of channels, then typically a multiplexer 20 time multiplexes the channel inputs which are then converted to digital form in an A/D converter 25 and applied to a digital filter 30. A simple counter/decoder (not shown) can provide the multiplexer 20 with a selection signal to route a desired channel input to the A/D converter 25. Alternatively, a processor 35 could supply the multiplexer 20 with the appropriate selection signal.

In accordance with the present invention, the A/D converter 25 receives an input signal that includes an unwanted signal component. The unwanted signal component can be any type of unwanted signal, such as power line noise, switching noise or crosstalk from another channel. It will be recognized that the input signal need not be provided by a signal conditioner 10 or multiplexer 20 as shown in FIG. 1.

The input signal received by the A/D converter 25 has a period that is longer than that of the unwanted signal component. In terms of frequency, it is well known that to properly sample a signal, samples must be taken at a rate that is at least twice the frequency of the signal being sampled. In terms of times, this means that the sampling interval must be no more than ½ of the period of the input signal or signal component being sampled.

Figure 2A:
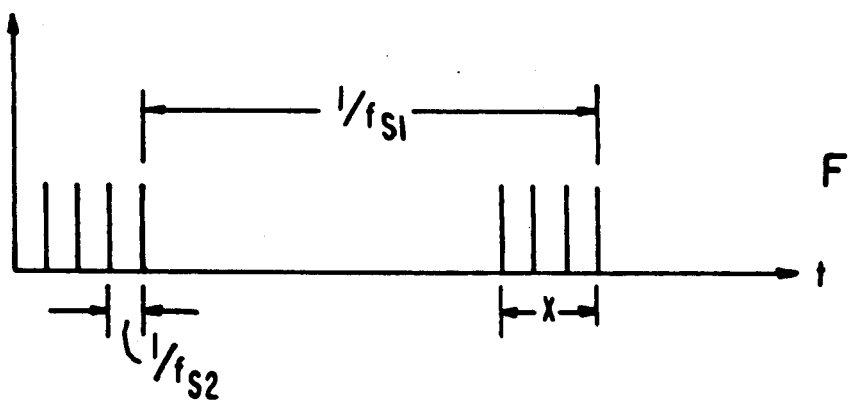
FIG. 2A is a timing diagram schematically illustrating the sampling of the present invention.
Figure 2B:
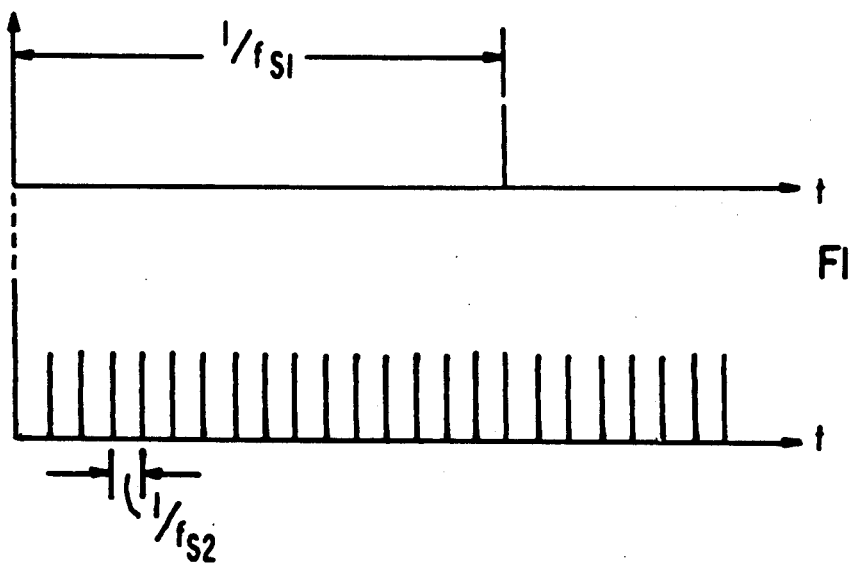
FIG. 2B is a timing diagram schematically illustrating continuous sampling.

Referring to FIG. 2A, the input signal is sampled at a first sampling interval equal to $1/f_{s1}$. Within this sampling interval, the input signal is sampled with a second sampling interval corresponding to $1/f_{s2}$ in order to properly sample the unwanted signal component In FIG. 2A, $f_{s1}$ corresponds to the sampling frequency or sampling rate of the input signal, and $f_{s2}$ corresponds to a second sampling rate or sampling frequency for sampling the unwanted signal component. As shown in FIG. 2A, it is a principle feature of the present invention that the second sampling interval ($1/f_{s2}$) is shorter than the first sampling interval ($1/f_{s1}$) and that a burst of signals is provided within the first sampling interval. The sampling of the present invention is in contrast to that shown in FIG. 2B wherein an input signal is continuously sampled with a sampling interval ($1/f_{s2}$).

In FIG. 1, the A/D converter 25 samples the input signal a number of times, each sample being spaced by the second sampling interval. This sampling is performed once during each first sampling interval. The A/D converter 25 therefore provides the digital filter 30 with a burst of samples during each first sampling interval. In FIG. 1, a controller 40 clocks the A/D converter 25 so that the A/D converter 25 provides the burst of samples, each spaced by the second sampling interval. The controller 40 can comprise any type of clocking circuitry in order to enable the A/D converter 25 at times such as shown in FIG. 2A. For example, the controller 40 can include a simple oscillator that provides a series of pulses with a spacing corresponding the second sampling interval, and another oscillator that provides pulses with a spacing corresponding to the first sampling interval and that have a width X such as shown in FIG. 2A. The width X should be at least one period of the unwanted signal component The lower frequency limit of the filter is defined by 1/X. The second pulses can be used as a gate (e.g., as an input to an AND gate) to permit the first pulses to trigger the A/D converter 25. Alternatively, the controller 40 can be located within the processor 35 or another processor in the system. It is sufficient that the A/D converter 25 be triggered to provide a burst of samples with a second sampling interval once during each sampling interval. Together the A/D converter 25 and controller 40 comprise a sampling means.

In FIG. 1, the digital filter 30 and system processing 45 are schematically illustrated as being implemented by a processor 35. The digital filter 30 and system processing 45 can also be implement in other ways including hard wired logic in, for example, a programmable logic array, or can be implemented by using a hardware digital filter and hardware system processing logic and signal conditioning (either analog or digital).

The digital filter 30, whether implemented through software in a processor 35 or by dedicated hardware comprises a digital filter means. In a preferred embodiment of the present invention, the digital filter 30 provides a three-pole backwards low pass filter that satisfies the following discrete time equations:

$$Y1n = Y1n-1 + \frac{(Vn - Y1n-1)}{R1} \quad \text{(1st pole)}$$

$$Y2n = Y2n-1 + \frac{(Y1n - Y2n-1)}{R2} \quad \text{(2nd pole)}$$

$$Y3n = Y3n-1 + \frac{(Y2n - Y3n-1)}{R3} \quad \text{(3rd pole)}$$

where:
Y3n is the updated filter value
Yjn−1 is the previous filter value
(j=2,3)
Vn is-the filter input
R1, R2 and R3 are the filter divisors In a preferred embodiment of the present invention, the filter divisors, R1, R2 and R3 have values of 4, 4 and 8 respectively. The values were chosen to be a power of two so as to reduce the division calculation to a fixed number of binary data shifts. In the above, Y3n is the filtered output provided by the digital output 30.

Figure 3A:
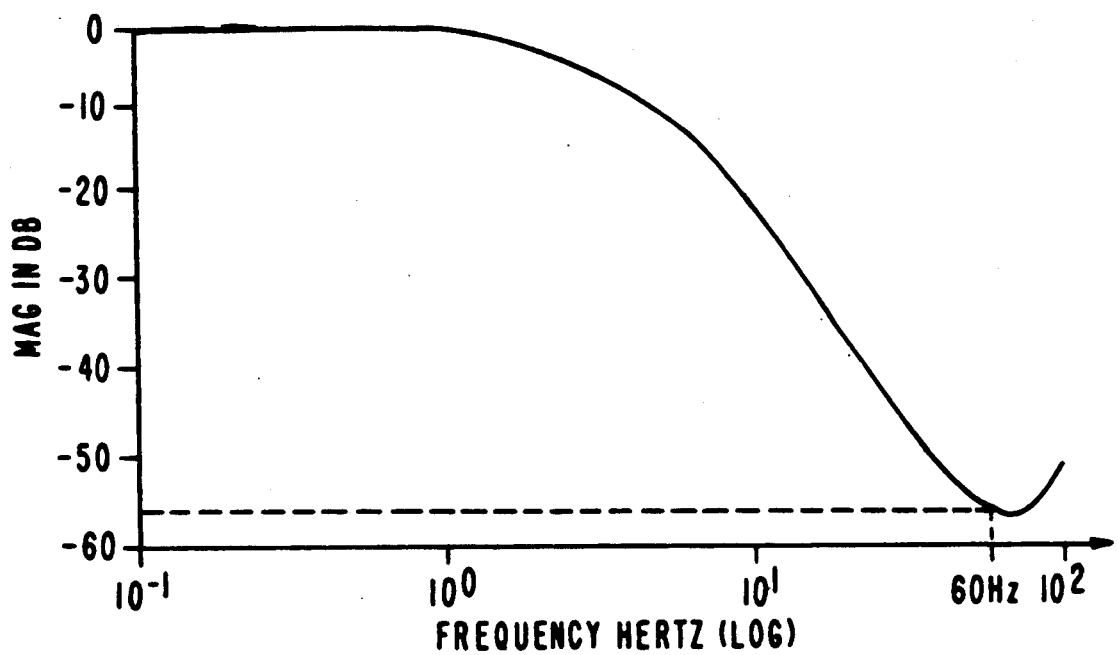
FIGS. 3A and 3B are graphs respectively showing the frequency response of a continuously sampling filter and a response of a filter embodying the present invention.
Figure 3B:
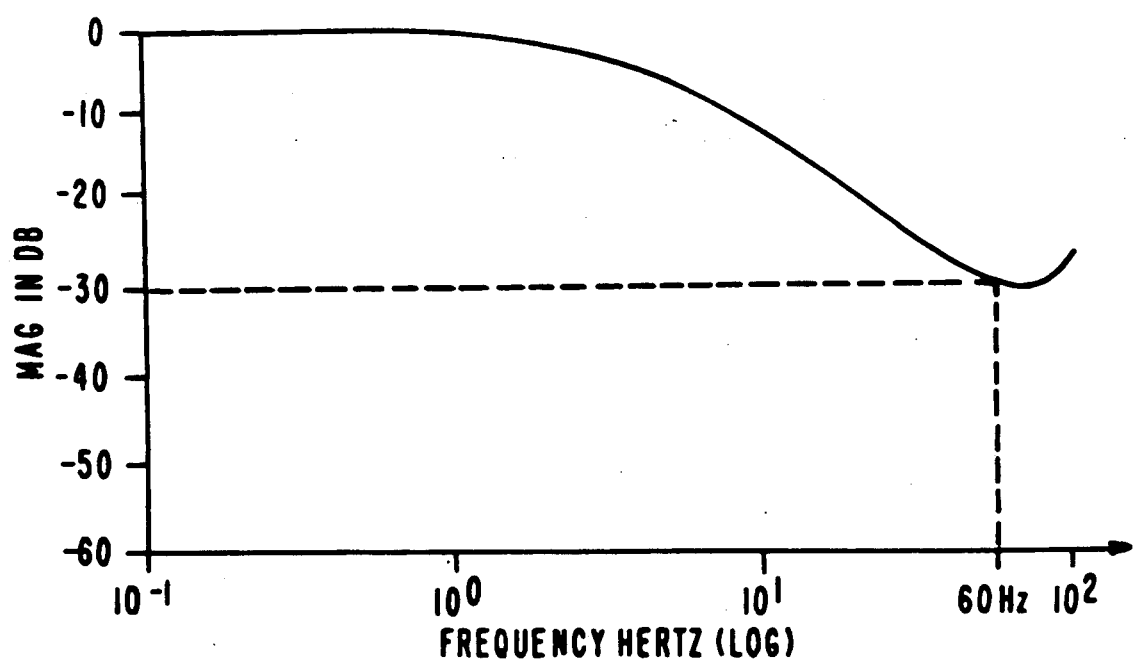

In a preferred embodiment of the present invention, the first sampling rate is 3.584 seconds, and the second sampling rate is 7ms. The 7ms is selected to ensure that line frequency noise (50Hz, 60Hz) is sampled to satisfy the Nyquist criterion. Referring to FIGS. 3A and 3B, it is seen that the burst sampling provides a degrading response compared to a continuously system. However, for the frequencies of interest (filtering line noise) the non-continuous sampled system (FIG. 3B) provides approximately 30 dB of normal mode rejection. The sampled digital filter system of the present invention therefore provides a filtered output that corresponds to the input signal, but with the unwanted signal component (e.g., line noise) substantially filtered.

While the present invention has been described with respect to specific embodiments, these embodiments are not intended to limit the present invention, which is instead, defined by the following claims.

What is claimed is:

1. A sampled digital filter system for processing an input signal including an unwanted signal component, said system comprising:
   sampling means having first and second sampling intervals, for receiving the input signal, for sampling the input signal with said second sampling interval for a limited time within said first sampling interval and for providing samples of the input signal as input samples; and
   digital filter means for digital filtering the input samples so as to provide a filtered output corresponding to the input signal with the unwanted signal component filtered out.

2. A sampled digital filter system according to claim 1, wherein said second sampling interval satisfies the Nyquist criterion for the unwanted signal component.

3. A sampled digital filter system according to claim 33, wherein the first sampling interval satisfies the Nyquist criterion for the input signal.

4. A sampled digital filter system according to claim 1, wherein said digital filter means comprises means for filtering, within said first sampling interval, samples of the input signal sampled with said second sampling interval.

5. A sampled digital filter system for processing an input signal including an unwanted signal component, said system comprising:
   sampling means for producing a burst of samples of the input signal at least once during a first period, the samples within the burst being spaced by a second period that is shorter than the first period; and
   digital filter means for digital filtering said burst of samples within the first period so as to provide a filtered output corresponding to the input signal with the unwanted signal component filtered out.

6. A sampled digital filter system according to claim 6, wherein said sampling means comprises:
   means for providing said burst of samples so that the samples within the burst satisfy the Nyquist criterion for the unwanted signal component.

* * * * *